(12) United States Patent
Carron et al.

(10) Patent No.: US 6,256,760 B1
(45) Date of Patent: Jul. 3, 2001

(54) AUTOMATIC TEST EQUIPMENT SCAN TEST ENHANCEMENT

(75) Inventors: Theodore Gregory Carron, Kanata; Richard A. Morrison, Chelsea, both of (CA)

(73) Assignee: Nortel Networks Limited, Montreal (CA)

(*) Notice: Subject to any disclaimer, the term of this patent is extended or adjusted under 35 U.S.C. 154(b) by 0 days.

(21) Appl. No.: 09/190,292

(22) Filed: Nov. 13, 1998

(51) Int. Cl.[7] ............................. G01R 31/28; G06F 11/00
(52) U.S. Cl. ............................. 714/726; 714/736
(58) Field of Search ...................... 714/726, 727, 714/728, 724, 733, 734, 736, 738, 742, 743, 744, 819, 820, 30, 37

(56) References Cited

U.S. PATENT DOCUMENTS

| | | | |
|---|---|---|---|
| 5,355,369 | 10/1994 | Greenbergerl et al. | 371/22.3 |
| 5,471,481 | * 11/1995 | Okumoto et al. | 714/727 |
| 5,619,512 | * 4/1997 | Kawashima et al. | 714/733 |
| 5,631,913 | * 5/1997 | Maeda | 714/732 |
| 6,073,263 | * 6/2000 | Arkin et al. | 714/738 |

* cited by examiner

Primary Examiner—Christine T. Tu

(57) ABSTRACT

An electronic test system used for scan testing of a device under test (DUT) is disclosed that includes a standard Automatic Test Equipment (ATE) tester and an additional test vector source apparatus called a Scanbox. The Scanbox enhances the scan pattern vector depth of any ATE system without requiring significant modifications to either its software or hardware. The Scanbox consists of a memory, an address counter, compare logic, control logic, and interface circuits. The scan vector data for the test data in (TDI) and expected test data out (ETDO) signals are stored within the Scanbox. These TDI signals are sent to the DUT during the test mode of operation while the tester provides the DUT with the test clock (TCLK), test mode select (TMS), and RESET signals. The tester further provides the Scanbox with BOXCLOCK and BOXRESET signals and the Scanbox provides the tester with a BOXERROR signal that is triggered high when the scan pattern vector data from the DUT does not match the corresponding ETDO signal. The tester is able to provide these clocking signals despite not necessarily having sufficient memory to perform the scan test with use of a repeat function within the tester. This allows the regular ATE system software and hardware to control the Scanbox without any significant modifications. Typical high-speed testers have very limited scan pattern vector depth. Hence, the addition of the Scanbox can enhance the capability of these testers, so that long scan test patterns can be performed. This eliminates the need for a second slow-speed tester being used exclusively for scan testing.

33 Claims, 4 Drawing Sheets

AUTOMATIC TEST EQUIPMENT SCAN TEST ENHANCEMENT

FIELD OF THE INVENTION

This invention relates to an apparatus and method for the scan testing of an integrated circuit (IC), specifically the scan testing of an integrated circuit with use of an enhanced testing system.

BACKGROUND OF THE INVENTION

Integrated circuits are currently being designed with substantially increased speed and complexity. The development of these complex high-speed integrated circuits increasingly depends upon the ability to test the circuitry sufficiently to ensure proper operation. As the number of logic gates in a given integrated circuit increases along with the overall clocking speed, the difficulty of testing the circuitry increases. The input test data, hereinafter referred to as test vectors, must also increase in order to gain sufficient fault coverage for the possible input states.

On less complex digital ICs, a commercial test machine within the factory is sufficient to test for functionality, by probing the wafer or testing the packaged part directly. For more complex chips, the fault coverage using this method is usually less than 100%. This coverage is dependent on how many vectors are used, how well the vectors are written, and the degree of complexity of the circuitry to be tested. Even if full coverage was attainable, this testing scheme cannot function with sufficient speed to test high-speed parts at their normal operation speed. As well, standard test vectors applied to the bond pads, as described above, cannot always be applied to digital circuitry requiring testing that is embedded in an application specific integrated circuit (ASIC) design.

A technique for testing that has been implemented within IC chips is Built In Self Test (BIST). This technique, includes internal BIST circuitry which is triggered to perform a predefined test with use of an externally applied signal to the chip. Typically during a BIST, a shift register produces a pseudo-random sequence that is applied to the circuitry under test. An expected signature is then compared to the outputs from the circuitry under test. BIST, although being used successfully in many areas, has a number of problems. For one, despite having BIST solutions for regular structures such as memories, there is no general way known to produce BIST for random logic with high fault coverage. In addition, BIST requires adding area resources and possibly speed resources to the chip, hence increasing costs and decreasing marketability.

To overcome the above problems and to allow for testing of more complex IC chips, a Joint Test Action Group (JTAG) test port was developed to perform on site testing of IC chips mounted on a board. The standard for the JTAG test port is defined as the Institute of Electrical and Electronics Engineers, Inc. (IEEE) Standard 1149.1, IEEE Standard Test Access Port and Boundary-Scan Architecture. In this standard, a Test Access Port (TAP) is added to each device under test or group of devices on a board. The TAP includes a test clock (TCLK) pin, a test mode select (TMS) pin, a test RESET pin, and a test data in (TDI) pin for inputting to the device under test, and a test data output (TDO) pin used to output from the device. All devices incorporating the JTAG standard contain a boundary scan register and a bypass register. The boundary scan register provides for serially shifting any desired data pattern from the TDI pin into the input stages of the device, for receiving the output data of each output stage of the chip, and for serially shifting these bits out through the TDO pin. The TMS allows for the enabling of the boundary scan register, the TCLK allows for the clocking of the registers, and RESET allows for the resetting of the registers.

One key advantage of the JTAG standard is that it allows arbitrary data to be serially scanned into a device's boundary scan register, with each bit position corresponding to an input or output terminal of the device. The data may then be applied as if it were test vectors input to or output from the chip. A problem with the JTAG testing scheme is that testing of a chip by serial scanning is relatively slow; hence functional testing cannot be performed at the full chip speed. This concern becomes more prevalent as newly designed IC chips gain increasing speeds.

Typical testing speeds for relatively low-speed testers that have the capability of JTAG scan testing range as high as 50 to 100 MHz. There currently exist publicly available testers capable of testing IC chips that function at much higher speeds. For example, an HP (Hewlett Packard) 83000 Model F660 tester produced by Hewlett Packard of Palo Alto, Calif. allows for testing in the range of 660 MHz to 1 GHz. Unfortunately, this tester only allows for 4 Megabytes of memory per pin for the input of test vectors, which is insufficient for a scan testing procedure on any relatively complex chip. This memory is heavily integrated on the tester, is water cooled, and has very high power consumption. Thus, adding memory to the tester is not a viable solution.

The method currently used to test complex high-speed integrated circuits is a two stage testing procedure. First the chip is tested for functionality using a low-speed tester that has the capability for scan testing. Secondly, the chip is tested on a high-speed tester such as the HP F660 tester to ensure proper workings at full chip speed. This two tiered system increases testing time and time to market of the chips since this procedure must be performed for every individual IC. Along with the increased time to market, the two tiered test system also requires that the device be handled twice, hence increasing the potential of damage to the device, and increasing the required capital investment for testing, that being two testers and their supporting facilities.

Therefore, a testing system is needed that will allow the scan testing protocol defined by the JTAG testing scheme to be implemented with a tester such as the high-speed HP 83000 F660. This system requires the capability to add memory resources to the tester without making any significant modifications to its internal hardware. As well, this testing system should not require the additional implementation of further test circuitry within the chip, hence increasing die area and therefore cost required for the testing of the chip. With such a testing system both full operating speed testing and scan testing should be performed with the same tester, thus eliminating the need for the scan testing tester, as well as the handling time associated with transporting each device under test to the second tester.

SUMMARY OF THE INVENTION

It is an object of the present invention to overcome at least one of the disadvantages of the prior art and, in particular, to provide an apparatus and method whereby an integrated circuit test system can more efficiently scan test a device under test.

According to a first aspect, the present invention provides a test vector source apparatus that is capable of scan testing a device under test (DUT) when running within an electronic test system comprising the test vector source apparatus, the DUT, and a test apparatus, the test vector source apparatus comprising: a memory storage device that stores a plurality of test data sets sufficient for scan testing of the DUT, each test data set comprising a test data in (TDI) signal and an expected test data out (ETDO) signal, the memory storage device selectively outputting a plurality of TDI signals to the DUT and being input with a clock signal from the test apparatus via a first coupling means; and a decision device that generates an error decision signal with use of a plurality of test data out (TDO) signals input from the DUT and the ETDO signals input from the memory storage device.

According to a second aspect, the present invention provides an electronic test system used for the scan testing of a device under test (DUT), comprising: a test vector source apparatus that selectively inputs a plurality of test data in (TDI) signals to the DUT and selectively receives a plurality of test data out (TDO) signals from the DUT, the test vector source apparatus comprising a memory storage device and a decision device; and a test apparatus that generates at least one clock signal that is input into the DUT and the test vector source apparatus; wherein a plurality of test data sets sufficient for scan testing of the DUT are stored in the memory storage device, each test data set comprising a TDI signal and an expected test data out (ETDO) signal; and wherein an error decision signal is generated in the decision device with use of the TDO signals and the ETDO signals.

According to a third aspect, the present invention provides a method of scan testing a device under test (DUT) within an electronic test system comprising a test vector source apparatus and a test apparatus, the test vector source apparatus functioning within a load mode of operation and a test run mode of operation, the method comprising the steps of: loading a plurality of test data sets into the test vector source apparatus during the load mode of operation, each test data set comprising a test data in (TDI) signal and an expected test data out (ETDO) signal; connecting, during the test run mode of operation, the test vector source apparatus to the test apparatus and the DUT; and running a test procedure on the DUT with use of the test data sets and at least one clock signal, generated by the test apparatus, input to the test vector source apparatus and the DUT; and wherein the running a test procedure on the DUT comprises the steps of inputting the TDI signals into the DUT, outputting a plurality of test data out (TDO) signals from the DUT, and generating an error decision signal by comparing the TDO signals with the corresponding ETDO signals.

According to a fourth aspect, the present invention provides a test vector source apparatus that is capable of scan testing a device under test (DUT) when running within an electronic test system comprising the test vector source apparatus, the DUT, and a test apparatus, the test vector source apparatus comprising: a data generator device that generates a plurality of test data sets, each test data set comprising a test data in (TDI) signal and an expected test data out (ETDO) signal, the data generator device selectively outputting a plurality of TDI signals to the DUT and being input with a clock signal from the test apparatus via a first coupling means; and a decision device that generates an error decision signal with use of a plurality of test data out (TDO) signals input from the DUT and the ETDO signals input from the data generator device.

BRIEF DESCRIPTION OF THE DRAWINGS

The preferred embodiment of the present invention will now be described with reference to the following figures, in which.

DETAILED DESCRIPTION OF THE PREFERRED EMBODIMENT

Figure 1:
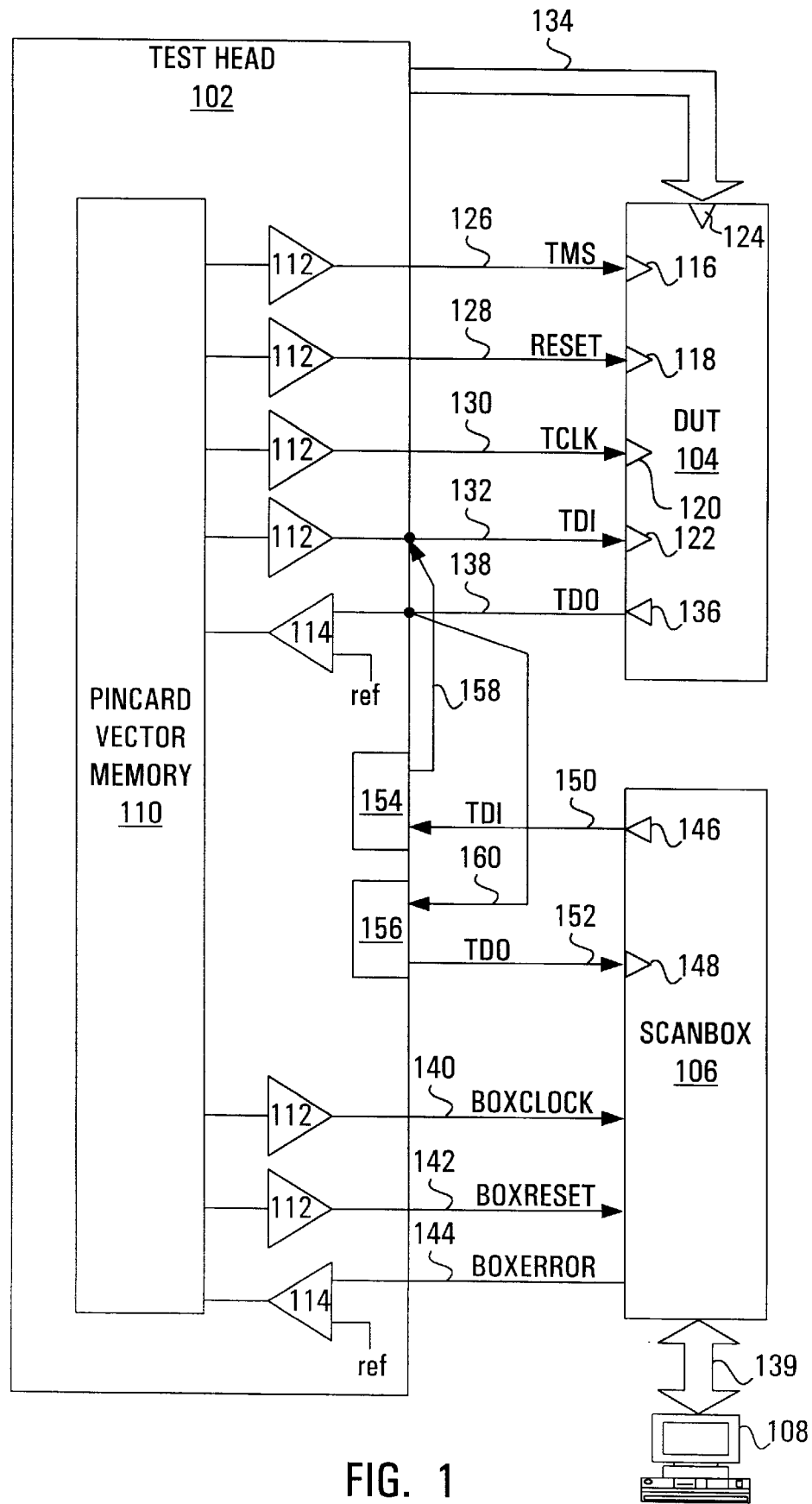
FIG. 1 is a simplified block diagram of the scan test system according to the preferred embodiment of the present invention.

The preferred embodiment of the present invention is the implementation of a scan test system with the use of an add-on memory source, hereinafter referred to as a Scanbox, along with a standard tester and a device under test (DUT). The tester for which the preferred embodiment of the present invention was specifically designed is the HP 83000 F660 high-speed tester. The DUT considered in the preferred embodiment is a typical high-speed digital IC with the JTAG TAP added.

The overall scan testing system, as contemplated by the present invention, comprising a test head 102, a DUT 104, a Scanbox 106, and a computing device 108 is now described with reference to FIG. 1. The test head 102, which is part of the HP F660 tester, is comprised of a pincard vector memory 110 and a plurality of digital pincards that each comprise a driver 112 and a comparator 114. The user of the test head 102 may utilize each digital pincard as a driver pincard 112 and/or a comparator pincard 114. The pincard vector memory 110 contains 4 Megavectors of memory cells per pincard 112,114. The memory cells are heavily integrated into the test head 102, have very high power consumption, and are water cooled. Therefore, the memory 110 cannot be increased without significant redesign. The digital drivers of pincards 112 are used for outputs from the test head 102, while the digital comparators of pincards 114 are used for inputs to the test head 102.

In the prior art testing system using the HP F660 tester, the outputs from the test head 102 include TMS, RESET, TCLK, and TDI which are input to respective input pins 116,118, 120,122 within the DUT 104 via respective short wires 126,128,130,132. As well, the power and other data signals required for the DUT 104 are output from the test head 102 and input to a plurality of input pins 124 within the DUT 104 via a plurality of short wires 134. The only input to the test head 102 for scan testing is typically TDO which is output from a TDO pin 136 within the DUT 104 via a short wire 138. All of these input and output signals are used to run standard JTAG test vectors in the prior art testing system. TMS enables the test mode of operation within the DUT 104, during which time the standard test vectors are clocked in with TCLK through the TDI pin 122. The resulting outputs are clocked out through the TDO pin 136 and checked with expected TDO (ETDO) bits. If RESET is triggered, all of the test registers within the DUT 104 return to an initial state. The key difficulty with the prior art setup is the insufficient memory for the TDI and TDO pincards 112,114 within the pincard vector memory 110. This lack of memory limits the number of test vectors that can be run without loading new test data within the memory 110. Since this additional loading of test vectors would be required for each individual DUT, the time and financial costs of such a procedure typically makes it infeasible. Hence, the complexity of the DUT 104 that can efficiently be fully scan tested with the prior art system is significantly limited.

In the setup as contemplated by the present invention, the system is modified with the addition of the Scanbox 106 to add additional test vector capacity to the system. The Scanbox 106, in the preferred embodiment of the present invention, comprises a plurality of electronic cards plugged into a back plane within a card cage and an internal power supply. The Scanbox 106 is interfaced to the computing device 108 via an Institute of Electrical and Electronic Engineer (IEEE) cable 139. This cable 139 is used to download vector and control register data to the Scanbox 106. The control register data, among other uses described herein below, sets up the two modes of operation for the Scanbox 106, those being a load mode and a test run mode. In the preferred embodiment, the computing device 108 is the HP F660 computer workstation, though any computing device may be used which allows for communicating through the IEEE interface cable 139, such as a standard personal computer (PC).

The outputs from the test head 102 are the same as in the prior art setup, but also include BOXCLOCK and BOXRESET which are output from digital driver pincards 112 to the Scanbox 106 via coaxial cables 140,142 respectively. The test head 102 also has one additional input to a digital comparator pincard 114, that being BOXERROR input from the Scanbox 106 via coaxial cable 144.

BOXCLOCK and TCLK are similar signals with a predetermined time advance on BOXCLOCK, created at the test head 102 by well known means, shifting them out of phase. This time advance is introduced to BOXCLOCK due to the difference in coupling means between the Scanbox 106 and the test head 102 and between the DUT 104 and the test head 102. The coaxial cable 140 connecting BOXCLOCK from the test head 102 to the Scanbox 106, in the preferred embodiment of the present invention, is a 6 foot RG174U coaxial cable which adds a delay to BOXCLOCK due to its inherent length. The short wire 130 coupling TCLK from the test head 102 to the DUT 104 does not add a significant delay. Therefore, as a result of the time advance introduced to BOXCLOCK, the Scanbox 106 is clocked such that outputs from the Scanbox 106, as described herein below, are input to the DUT 104 at the proper time relative to the clocking of the DUT 104 with TCLK. In the preferred embodiment, there are circumstances in which a resetting of both the DUT 104 and the Scanbox 106 is required simultaneously. In such a situation, BOXRESET input to the Scanbox 106 is advanced, in similar fashion to BOXCLOCK, to coordinate with RESET being input to the DUT 104.

The TDI and TDO pins 122,136 in the DUT 104 are connected via respective short wires 132,138 to a pincard driver 112 and a pincard comparator 114 within the test head 102 respectively. As well, TDI and TDO pins 146,148 within the Scanbox 106 are also coupled to the same pincard driver 112 and pincard comparator 114 via respective coaxial cables 150,152 which connect to the test head 102 at respective pincard locations 152,154, not containing actual pincards, which are further connected, via respective short wires 158,160, to the pincards 112,114 associated with the TDI and TDO pins 122,136 from the DUT 104. As will be described later, the TDI pin 122 selectively has inputs from and the TDO pin 136 selectively has outputs to the test head 102 and the Scanbox 106 in operation. This allows the Scanbox 106 to take over the inputting of the test vectors into the DUT 104 on the TDI pin 122 and the receiving of the output results from the TDO pin 136. The Scanbox 106, subsequently, compares the results with expected outcomes, determines if an error has occurred, and triggers BOXERROR high if an error is found.

Figure 2A:
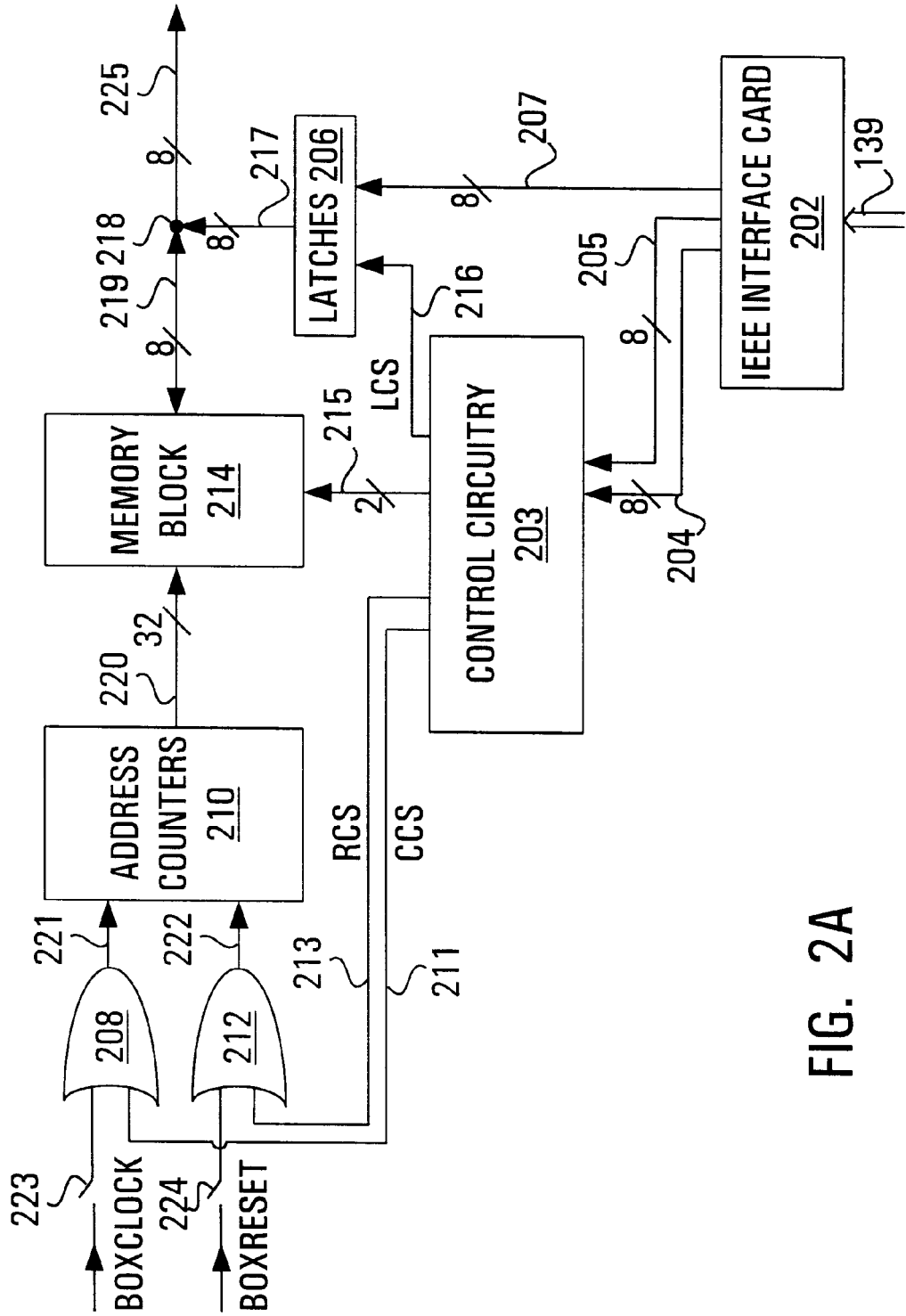
FIGS. 2a and 2b are simplified block diagrams depicting the internal functioning of a Scanbox according to the preferred embodiment of the present invention.
Figure 2B:
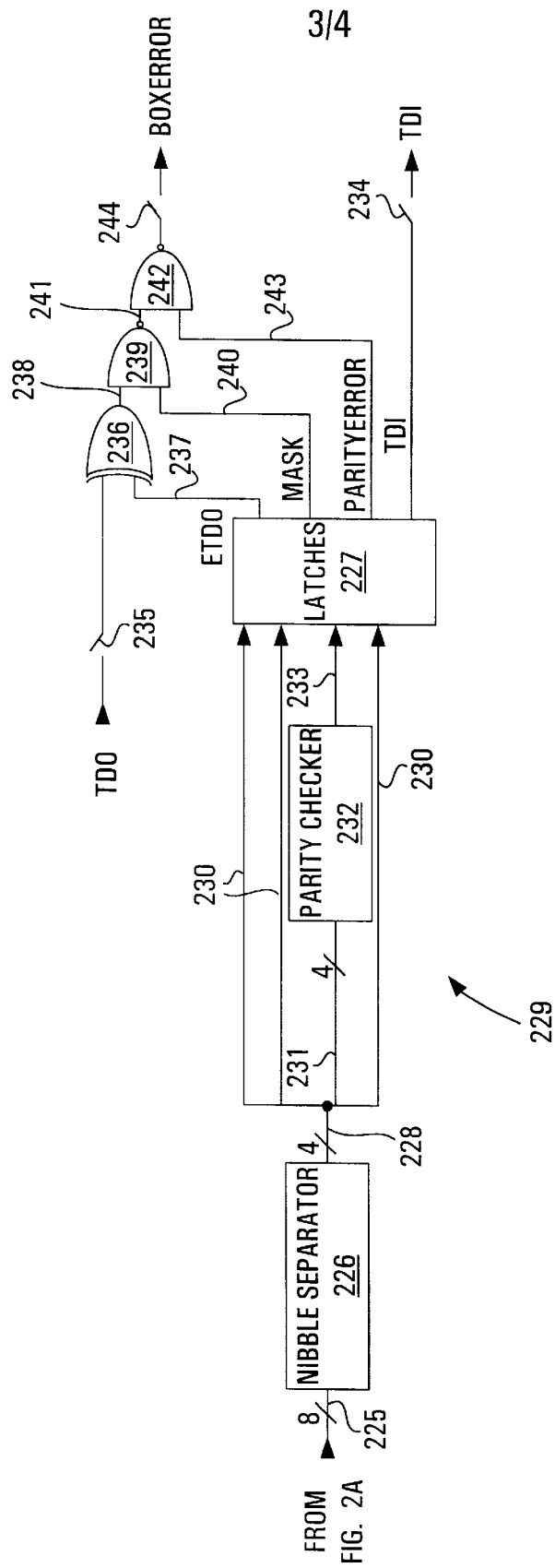

The detailed implementation of the Scanbox 106 in the system, as contemplated by the preferred embodiment of the present invention, is described herein below with reference to FIGS. 2a and 2b. A standard general purpose interface bus (GPIB) interface card 202 externally connected to the computing device 108 via the IEEE interface cable 139 is, within the Scanbox 106, connected to control circuitry 203 by 8 bit buses 204,205 and connected to a first set of latches 206 by an 8 bit bus 207. In the preferred embodiment, the interface card 202 is produced by IOtech, Inc., of Cleveland, Ohio and is model Digital488HS/32. The interface card 202 sends first and second bytes of data, via the 8 bit bus 204 and the 8 bit bus 205 respectively, to the control circuitry 203 which comprises a series of control registers. The first byte of data determines the type of information that is being sent within the second byte of data and therefore directs the second byte of data to the appropriate register within the control circuitry 203. In the preferred embodiment, control data loaded into registers with this technique comprise a load/run signal, an internal reset signal, and BOXERROR, TDI, TDO, BOXRESET, and BOXCLOCK relay control signals.

The second byte of data may instead contain test vectors used in the scan test procedure rather than control signals. Thus, the second byte of data is also sent from the interface card 202 to the first set of latches 206, via the 8 bit bus 207, where, in the preferred embodiment, the test vectors are sent through, as described herein below. Although not shown, a standard Data Available (DAV) signal and BUSY signal are used to determine when the bits being sent are stable and when the bits being sent have been fully received respectively.

The control circuitry 203 is connected via a 1 bit line 211 to a first digital logic device 208 used to clock address counters 210, via a 1 bit line 213 to a second digital logic device 212 used to reset the address counters 210, via a 2 bit bus 215 to a memory block 214 addressed by the address counters 210, and via a 1 bit line 216 to the first set of latches 206.

The memory block 214 is used to store the test vectors input two at a time as the second byte from the computing device 108. The pair of test vectors, totalling 8 bits, are input through the GPIB interface card 202, the 8 bit bus 207, the first set of latches 206, an 8 bit bus 217, a common node 218, and an 8 bit bus 219 to the memory block 214 which is arranged as 8 bits wide by 20 Megabytes deep in one embodiment. The test vector pair consists of an upper and lower nibble, each nibble consisting of one of the test vectors which comprise a TDI bit, an ETDO bit, a MASK bit, and a PARITY bit.

The pairs of test vectors are input to the first set of latches 206 via the 8 bit bus 207 and then clocked into the memory block 214 via the 8 bit bus 217, the common node 218, and the 8 bit bus 219, by a latch control signal (LCS). The LCS is generated at the control circuitry 203 with use of the load/run signal and input to the first set of latches 206 via the 1 bit line 216. The memory block 214, regulated by output enable (OE) and write enable (WE) signals generated at the control circuitry 203 with use of the load/run signal and input to the memory block 214 via the 2 bit bus 215, stores the pairs of test vectors at the addresses input, via a 32 bit bus 220, from the address counters 210. The address counters 210 are controlled by the output of the first and second digital logic devices 208,212 via 1 bit lines 221,222 respectively.

Both the first and second logic devices 208,212 functionally operate as OR gates. The first digital logic device 208 takes as input, via the 1 bit line 211, a clock control signal (CCS), generated in the control circuitry 203 with use of the load/run signal, and BOXCLOCK provided by the test head 102 via a relay switch 223 controlled by the BOXCLOCK relay signal. The second digital logic device 212 takes as input, via the 1 bit line 213, a reset control signal (RCS), generated in the control circuitry 203 with use of the load/run and internal reset signals, and BOXRESET provided by the test head 102 via a relay switch 224 controlled by the BOXRESET relay signal. During the load mode of operation in which the test vectors are input two at a time and stored in the memory block 214, the CCS and RCS control the clocking and resetting of the address counters 210 respectively while BOXCLOCK and BOXRESET are set low. During the test run mode of operation in which the memory block 214 is outputting test vectors to the DUT 104, BOXCLOCK and BOXRESET control the clocking and resetting of the address counters 210 respectively while CCS and RCS are set low. The address counters 210 sequentially address the memory block 214 starting at a reset value of 00000000 and increasing by single increments for each subsequent clock pulse.

During the test run mode, the first set of latches 206 are disabled and the pairs of test vectors stored in the memory block 214 are sequentially clocked out, through the 8 bit bus 219, the common node 218, and an 8 bit bus 225, to a nibble separator 226 which separates the upper and lower nibbles. The nibble separator 226 outputs individual nibbles, representing individual test vectors, to a second set of latches 227 via a 4 bit bus 228 and a coupling means 229. In the preferred embodiment, a nibble is latched within the second set of latches 227 to ensure that the bits of the nibble are constant while the nibble separator 226 and the address counters 210 select the subsequent nibble. An alternative embodiment of the present invention does not include the second set of latches 227, using other means to ensure the bits remain constant.

The coupling means 229 comprises a 1 bit line 230 for each of the ETDO bit, the MASK bit, and the TDI bit, and a 4 bit bus 231, a parity checker 232, and a 1 bit line 233 for inputting a PARITYERROR bit to the second set of latches 227. The parity checker 232 takes as input all four bits of a nibble from the 4 bit bus 231, determines the parity of the nibble and triggers PARITYERROR low if the parity is odd. The parity bit sets the parity of each nibble to even, in the preferred embodiment, so that if the parity is odd a parity error is detected. This is done to determine if detected scan test errors are actually due to faulty memory cells in the memory block 214. In the case that a parity error is detected, the test vectors should be reloaded into the memory block 214. If the parity errors persist, the memory block 214 should be replaced.

For each nibble, the TDI bit is clocked through the second set of latches 227 and input, via a relay switch 234 controlled by the TDI relay signal, to the DUT 104. A TDO signal, output from the DUT 104, is input to the Scanbox 106, via a relay switch 235 controlled by the TDO relay signal, to a third digital logic device 236. The third logic device 236 functionally operates as an exclusive OR gate with inputs of the TDO signal from the DUT 104 and the ETDO bit, via a 1 bit line 237, from the second set of latches 227. If the two bits match up, the output from the third logic device 236 is low while if the bits don't match, an error is detected and the output is high.

The output from the third logic device 236 is input, via a 1 bit line 238, to a fourth digital logic device 239 which also takes as input the MASK bit from the second set of latches 227, via a 1 bit line 240. The fourth logic device 239 functionally operates as a NAND gate which filters out errors detected during portions of the test pattern where the actual state of the TDO signal is not important. An output result of high at the fourth logic device 239 indicates that either no error occurred and/or the MASK bit is set low due to the TDO signal being unimportant. On the other hand, an output of low at the fourth digital logic device 239 indicates that a significant error has occurred.

The output of the fourth logic device 239 is input, via a 1 bit line 241, along with the PARITYERROR bit into a fifth digital logic device 242 which functionally operates as a NAND gate. The PARITYERROR bit, generated by the parity checker 232 as described previously, is input to the fifth logic device 242 via the 1 bit line 233, the second set of latches 227, and a 1 bit line 243. The fifth digital logic device 242 generates BOXERROR which is input to the test head 102 via a relay switch 244 controlled by the BOXERROR relay signal. BOXERROR is high in the case that a significant error is detected and is low otherwise.

In normal operation, the test head 102 outputs one test vector, hereinafter referred to as a test head vector, to the DUT 104 for every clock cycle. The implementation, as contemplated by the present invention, utilizes a repeat function in the HP F660 tester which allows for many clock cycles to be generated with only a single repeated test head vector being output. This allows, during a Scanbox test run mode of operation, the Scanbox 106 to take over the testing of the DUT 104 while the test head 102 is still providing the clocking as described herein below.

A test vector software package that functions with any standard tester would operate properly within the test system of the preferred embodiment. While the Scanbox 106 is loaded with the test vector pairs required for scan testing, the tester, in which the Scanbox 106 is connected, is loaded with a highly compressed version of the original test pattern. Within this compressed pattern, the test head 102 only retains control of the TMS pin, the TCLK pin, the RESET pin, and any other DUT pins that may be required for boundary scan inputs or outputs. All long series of test head vectors that only have TCLK and TDI or TDO changing become compressed to a single test head vector, repeated the appropriate number of times. Other than vectors required for setting up the TMS pin and RESET pin for the DUT 104, the tester would only apply a single test head vector a repeated number of times. In most testers, there is a limited number of times a test vector can be repeated, this limited number being relatively large. Therefore, in the preferred embodiment, if a test head vector is required to be repeated more than the maximum number of times, than additional identical test head vectors are added until the total number of repeats is correct for the particular test pattern.

Figure 3:
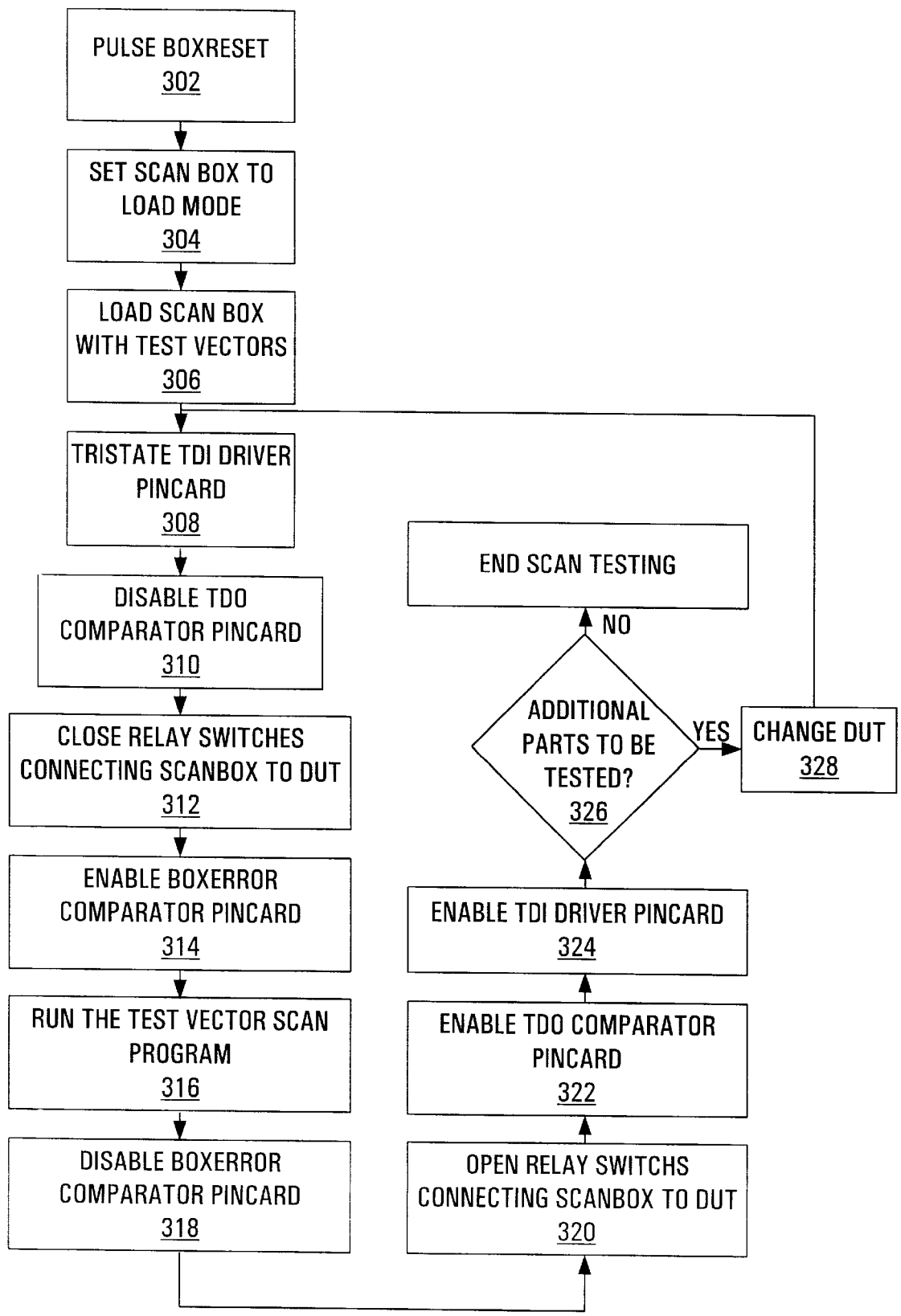
FIG. 3 is a flow chart illustrating the steps within the implementation of a test procedure on the scan test system as depicted in FIG. 1.

To perform a scan test of a DUT, using the testing system depicted in FIG. 1, the procedure described herein below with reference to FIG. 3 is followed in the preferred embodiment. In the preferred embodiment, all of the steps within this procedure are either performed with use of the control circuitry 203 in the Scanbox 106 or by well known means at the test head 102 level. The first step in this implementation, as depicted at step 302, is to reset the address counters 210 within the Scanbox 106 to address 00000000, through a pulsing of the BOXRESET at the test head 102. For the BOXRESET pulse to be received within the Scanbox 106, the relay switch 224 must be closed with use of the BOXRESET relay signal.

Next, the Scanbox 106 is set, with use of the load/run signal and the control circuitry 203, to the load mode at step 304, in which the first set of latches 206 is enabled, the address counters 210 are controlled by the RCS and CCS, the WE signal is activated, and the OE signal is deactivated. At step 306, the test vector pairs are individually input from the computing device 108 through the IEEE interface cable 139, the GPIB interface card 202, the 8 bit bus 207, the first set of latches 206, the 8 bit bus 217, the common node 218, and the 8 bit bus 219 to the memory block 214 where the pairs of test vectors are stored sequentially due to the serial nature of the addressing produced by the address counters 210.

The TDI driver pincard 112 in the test head 102 is then tristated at step 308, the TDO comparator pincard 114 is disabled at step 310, and as depicted at step 312, the Scanbox 106 is connected to the DUT 104 at step 312. This connection to the DUT 104 is accomplished by closing, with use of the TDI and TDO relay signals, the relay switches 234,235 that essentially isolate the Scanbox 106 from the DUT 104 while not running the test vectors. This separation of the Scanbox 106 is done to ensure that no unnecessary loading is placed on the DUT pins during the DC parametric tests or full operating speed tests. Subsequently at step 314, the BOXERROR comparator pincard 114 within the test head 102 is enabled and the relay switch 244, controlled by the BOXERROR relay signal, is closed, so that the test head 102 can monitor the errors detected by the Scanbox 106.

At step 316, the test vectors saved within the memory block 214 are run on the DUT 104 from the Scanbox 106. A TDI signal is provided to the DUT 104 by the Scanbox 106 and a TDO signal is output from the DUT 104 to the Scanbox 106. The clocking of the DUT 104 and the Scanbox 106 is generated by the HP F660 tester while the tester is utilizing the repeat function as described herein above. It appears at the test head 102 that it is testing the same test head vector repeatedly, while in fact, it is controlling the scan testing performed by the Scanbox 106 on the DUT 104. If an error is detected during the scan testing performed by the Scanbox 106, BOXERROR, received at the test head 102, is flagged high. In this circumstance, the tester treats the error as a regular pattern error for the single test head vector that is being repeated and outputs a failure for the scan pattern. When a failure in the scan pattern is detected, in the preferred embodiment, the test vector that caused the error is determined by observing the number of repeats that had been applied at the tester prior to the error. In one embodiment, the Scanbox 106 can determine which test vector caused the error by reading back the number of test vectors performed prior to the error being detected. In an exemplary implementation of these embodiments, the test vector which caused the error can be located on a timing diagram and subsequently be used to identify the problem area within the DUT 104. In one embodiment, this is done with use of a well known internal timing diagram diagnostic tool within the test head 102.

At the completion of the scan test program, the BOXERROR comparator pincard 114 is disabled at step 318, the Scanbox 106 is disconnected, at step 320, from the DUT 104 through the opening of the relay switches 234,235, and the TDO comparator pincard 114 and the TDI driver pincard 112 are enabled at steps 322 and 324. At this point, the scan testing of the particular DUT 104 is complete. Other functional testing may than take place as normal, without any adjustments to or transportation of the DUT 104.

Typically, there are large numbers of identical parts that all must be tested under similar scan test patterns. If there are additional parts to be tested at step 326, the DUT 104 is changed at step 328 and the process of scan testing the new part is restarted at step 308. This is one advantage of the testing setup as contemplated by the present invention. The test vectors do not need to be reloaded into the memory block 214 for each identical part to be tested. If the HP F660 tester attempted to perform a scan test on a particular device without the use of the Scanbox 106, it is likely that it would require loading new test vectors into the pincard vector memory 110 numerous times to complete the test. This would be necessary for every part that is scan tested, thus significantly increasing the overall testing time.

There are numerous other advantages of using the Scanbox 106 within a test system similar to FIG. 1. One key advantage is the transparency of the Scanbox 106 to the tester being utilized. Considerable change is not required in the software used to generate the test vectors and no significant change is required within the hardware of the tester. Another advantage of the present invention is the fact that there is a significant reduction in capital expenditure required to functionally and scan test integrated circuits. If a company, especially a small company with limited resources, wants to test high-speed ICs, it only must purchase a high-speed tester and the Scanbox 106. There is no requirement for a slow-speed tester required for scan testing. In the test system according to the present invention, the high-speed tester can be adapted to accommodate scan testing. The Scanbox 106 can also be used to economically upgrade older slow-speed testers that cannot perform long scan tests.

Although the preferred embodiment of the present invention is designed to be implemented with the HP F660 high-speed tester, the present invention can alternatively be implemented with another clocking apparatus. This apparatus could comprise another commercially available tester that might have sufficient memory for scan testing. The advantages of using the Scanbox 106 despite having a tester that can perform scan testing is that with additional functional tests that may need to be executed, the memory within the tester may not be sufficient to store all of the test patterns required without having to reload the memory. With use of the Scanbox 106, the functional test patterns can be loaded into the memory within the tester while the large scan test patterns can be loaded in the Scanbox 106.

Alternative embodiments of the present invention have additional control signals loaded within the registers of the control circuitry 203. One such control signal is a pattern halt flag that, when triggered by the user of the test system, stops the test pattern when an error occurs. Another similar control signal, within one embodiment, is a parity halt flag that also may be triggered by the user and that in the case of a parity error, stops the test pattern from continuing. Yet another embodiment includes an additional register within the control circuitry 203 that allows for the preloading of addresses within the address counters 210 of the Scanbox 106. With this feature, test vector pairs within the memory block 214 may be reloaded individually without the reloading of the entire memory block 214. Also, this can allow for the start of a test pattern to begin at an arbitrary address rather than the reset value of 00000000.

The preferred embodiment is implemented with mechanical relay switches, though solid state relays could be utilized. The advantage of mechanical relays is that they can completely isolate the two sides of the relay more efficiently than solid state relays. The preferred embodiment, as described herein above, has the relay switches implemented within the Scanbox 106. Alternative embodiments have the relay switches implemented within the test head 102. The advantage of having the switches physically local to the test head 102, is that the cables used to connect the signals to the Scanbox 106 will be disconnected from the DUT's TDI and TDO pins 122,136 physically closer to the DUT 104 during non-Scanbox operations, therefore reducing the capacitance load on the TDI and TDO pins 122,136. The disadvantage of locating the relay switches on the test head 102 is that they would be required on every test head 102, thus adding considerable cost.

Although the implementation of the preferred embodiment described above is for a single scan chain, it is clear that with minor modifications, alternative embodiments can be developed for cases where parallel scan chains are required, hence having a plurality of TDI and TDO pins on the DUT 104.

Yet another alternative embodiment of the present invention includes the addition of an extra printed circuit board that contains a programmable Linear Feedback Shift Register (LFSR) and associated circuitry which generates a long pseudo-random logic stream. With this addition, the Scanbox 106 can directly generate the scan test vectors and the user of the Scanbox 106 must only input a few signatures for comparison to the test outputs from the DUT 104. Therefore, there is not necessarily a requirement for the memory block 214. Extremely high numbers of test vectors could be run on the DUT 104, if required, using this alternative implementation.

Persons skilled in the art will appreciate that there are alternative implementations and modifications possible to use an apparatus similar to that described above to perform high speed scan testing on devices under test, and that the above implementation is only an illustration of this embodiment of the invention. The scope of the invention, therefore, is only to be limited by the claims appended hereto.

What is claimed is:

1. A test vector source apparatus that is capable of scan testing a device under test (DUT) when running within an electronic test system comprising the test vector source apparatus, the DUT, and a test apparatus, the test vector source apparatus comprising:

a memory storage device that stores a plurality of test data sets sufficient for scan testing of the DUT, each test data set comprising a test data in (TDI) signal and an expected test data out (ETDO) signal, the memory storage device selectively outputting the TDI signals to the DUT and being input with a clock signal from the test apparatus via a first coupling means; and a decision device that generates an error decision signal with use of a plurality of test data out (TDO) signals input from the DUT and the ETDO signals input from the memory storage device.

2. A test vector source apparatus according to claim 1, further comprising a switching means for selectively enabling the output of the TDI signals from the memory storage device and a switching means for selectively enabling the input of the TDO signals to the decision device.

3. A test vector source apparatus according to claim 2, wherein at least one of the switching means is a mechanical switching means.

4. A test vector source apparatus according to claim 1, wherein the first coupling means comprises an addressing device that is input with the clock signal from the test apparatus and outputs a plurality of addressing signals to the memory storage device.

5. A test vector source apparatus according to claim 4, further comprising a switching means for selectively enabling the input of the clock signal to the addressing device and a switching means for selectively enabling the output of the error decision signal from the decision device.

6. A test vector source apparatus according to claim 4, wherein the addressing device is input with a reset signal output by the test apparatus.

7. A test vector source apparatus according to claim 6, further comprising a switching means for selectively enabling the input of the reset signal to the addressing device.

8. A test vector source apparatus according to claim 4, further comprising a control device and a logic device;

wherein the test vector source apparatus functions within a load mode of operation and a test run mode of operation;

wherein the control device generates a write enable signal and an output enable signal that are input to the memory storage device, and a clock control signal that is input to the logic device; and wherein the logic device, further input with the clock signal, clocks the addressing device with the clock control signal during the load mode of operation and clocks the addressing device with the clock signal during the test run mode of operation.

9. A test vector source apparatus according to claim 4, further comprising a control device, a first logic device, and a second logic device;

wherein the test vector source apparatus functions within a load mode of operation and a test run mode of operation;

wherein the addressing device is input with a reset signal output by the test apparatus;

wherein the control device generates a write enable signal and an output enable signal that are input to the memory storage device, a clock control signal that is input to the first logic device, and a reset control signal that is input to the second logic device;

wherein the first logic device, further input with the clock signal, clocks the addressing device with the clock control signal during the load mode of operation and clocks the addressing device with the clock signal during the test run mode of operation; and wherein the second logic device, further input with the reset signal, resets the addressing device with the reset control signal during the load mode of operation and resets the addressing device with the reset signal during the test run mode of operation.

10. A test vector source apparatus according to claim 1, wherein the electronic test system further comprises a computing device, and the test vector source apparatus further comprises an interface device coupled to the memory storage device for loading the test data sets from the computing device.

11. A test vector source apparatus according to claim 10, wherein the interface device is a general purpose interface bus (GPIB).

12. A test vector source apparatus according to claim 1, further comprising a test data generator which generates the plurality of test data sets and inputs the test data sets into the memory storage device.

13. A test vector source apparatus according to claim 1, wherein the decision device comprises a first logic device that compares each TDO signal with the corresponding ETDO signal.

14. A test vector source apparatus according to claim 13, wherein each test data set further comprises a masking signal; and wherein the decision device further comprises a second logic device that takes as input each masking signal and the corresponding output from the first logic device.

15. A test vector source apparatus according to claim 14, wherein each test data set further comprises a parity check signal;
wherein the decision device further comprises a parity checking device which determines if each test data set is of a correct parity by taking as input each TDI signal and the corresponding ETDO, masking, and parity check signals from the memory storage device; and
wherein the decision device further comprises a third logic device that takes as input each output of the parity checking device and the corresponding output from the second logic device.

16. A test vector source apparatus according to claim 1, wherein if the decision device triggers the error decision signal active, an error in the DUT is indicated; and
wherein the test vector source apparatus indicates, when the error decision signal is triggered active, which test data set caused the error in the DUT.

17. A test vector source apparatus according to claim 16, wherein the test vector source apparatus indicates which test data set caused the error in the DUT by counting the number of test data sets prior to the error in the DUT.

18. A test vector source apparatus according to claim 1, further comprising a nibble separator coupled between the memory storage device and the decision device;
wherein the memory storage device saves at least two test data sets simultaneously and outputs the at least two test data sets simultaneously to the nibble separator; and
wherein the nibble separator outputs one of the at least two test data sets to the decision device at one time.

19. A test vector source apparatus according to claim 1, wherein the memory storage device comprises a TDI pin for outputting serially the TDI signals to the DU and the decision device comprises a TDO pin for inputting serially the TDO signals from the DUT.

20. A test vector source apparatus according to claim 1, wherein the memory storage device further stores at least one plurality of additional test data sets, each additional test data set comprising an additional TDI signal and an additional ETDO signal;
wherein the memory storage device further selectively outputs the additional TDI signals to the DUT;
wherein the decision device generates at least one of the error decision signal and an additional error decision signal with use of a plurality of additional TDO signals input from the DUT and the additional ETDO signals input from the memory storage device; and
wherein the test vector source apparatus further comprises a first TDI pin for outputting serially the TDI signals to the DUT, at least one additional TDI pin for outputting serially the additional TDI signals to the DUT, a first TDO pin for inputting serially the TDO signals from the DUT, and at least one additional TDO pin for inputting serially the additional TDO signals from the DUT.

21. An electronic test system used for the scan testing of a device under test (DUT), comprising:
a test vector source apparatus that selectively inputs a plurality of test data in (TDI) signals to the DUT and selectively receives a plurality of test data out (TDO) signals from the DUT, the test vector source apparatus comprising a memory storage device and a decision device; and
a test apparatus that generates at least one clock signal that is input into the DUT and the test vector source apparatus;
wherein a plurality of test data sets sufficient for scan testing of the DUT are stored in the memory storage device, each test data set comprising a TDI signal and an expected test data out (ETDO) signal; and
wherein an error decision signal is generated in the decision device with use of the TDO signals and the ETDO signals.

22. An electronic test system according to claim 21, further comprising a computing apparatus for generating the plurality of test data sets; and
wherein the test vector source apparatus further comprises an interface device for coupling between the computing apparatus and the test vector source apparatus.

23. An electronic test system according to claim 21, wherein the test apparatus generates a first clock signal that is input to the DUT and a second clock signal that is input to the test vector source apparatus.

24. An electronic test system according to claim 23, further comprising a first coupling device for coupling between the test vector source apparatus and the test apparatus and a second coupling device for coupling between the test apparatus and the DUT;
wherein the first clock signal is advanced compared to the second clock signal to compensate for the difference in the first and second coupling devices.

25. An electronic test system according to claim 24, wherein the first coupling device comprises a relatively long coaxial cable and the second coupling device comprises a relatively short wire.

26. An electronic test system according to claim 21, in which there is a normal mode of operation in which the test vector source apparatus is disconnected from the test apparatus and the DUT;
wherein the test apparatus comprises a second memory storage device and a second decision device; and
wherein, during the normal mode of operation, the test apparatus stores in the second memory storage device a second plurality of test data sets, and generates a second error decision signal in the second decision device with use of the second test data sets.

27. An electronic test system according to claim 21, wherein the test apparatus is capable of operating in a repeat mode of operation;
wherein, during the repeat mode of operation, the test apparatus generates an identical test data set every pulse of the at least one clock signal, the identical test data set being the same for every pulse of the at least one clock signal; and
wherein, during the repeat mode of operation, the identical test data set is not output from the test apparatus to the DUT.

28. An electronic test system according to claim 21, wherein the test apparatus is a Hewlett Packard 83000 high speed tester.

29. An electronic test system according to claim 21, wherein the test apparatus further generates at least one reset signal input to the DUT and the test vector source apparatus.

30. An electronic test system according to claim 29, wherein the test apparatus generates a first reset signal input to the DUT and a second reset signal input to the test vector source apparatus.

31. A method of scan testing a device under test (DUT) within an electronic test system comprising a test vector source apparatus and a test apparatus, the test vector source apparatus functioning within a load mode of operation and a test run mode of operation, the method comprising the steps of:

loading a plurality of test data sets into the test vector source apparatus during the load mode of operation, each test data set comprising a test data in (TDI) signal and an expected test data out (ETDO) signal;

connecting, during the test run mode of operation, the test vector source apparatus to the test apparatus and the DUT; and running a test procedure on the DUT with use of the test data sets and at least one clock signal, generated by the test apparatus, input to the test vector source apparatus and the DUT; and wherein the running a test procedure on the DUT comprises the steps of inputting the TDI signals into the DUT, outputting a plurality of test data out (TDO) signals from the DUT, and generating an error decision signal by comparing the TDO signals with the corresponding ETDO signals.

32. A method according to claim 31, wherein the method further comprises the steps of:

disconnecting the test vector source apparatus from the DUT and the test apparatus;

switching the DUT with a similar DUT;

reconnecting the test vector source apparatus with the similar DUT and the test apparatus; and running the test procedure on the similar DUT with use of the test data sets and the at least one clock signal.

33. A test data source apparatus that is capable of scan testing a device under test (DUT) when running within an electronic test system comprising the test data source apparatus, the DUT, and a test apparatus, the test vector source apparatus comprising:

a data generator device that generates a plurality of test data sets, each test data set comprising a test data in (TDI) signal and an expected test data out (ETDO) signal, the data generator device selectively outputting the TDI signals to the DUT and being input with a clock signal from the test apparatus via a first coupling means; and a decision device that generates an error decision signal with use of a plurality of test data out (TDO) signals input from the DUT and the ETDO signals input from the data generator device.

\* \* \* \* \*